(12) United States Patent
Machida et al.

(10) Patent No.: US 10,566,042 B2
(45) Date of Patent: Feb. 18, 2020

(54) MAGNETIC TUNNEL JUNCTION DEVICES AND MAGNETORESISTIVE MEMORY DEVICES

(71) Applicant: Samsung Electronics Co., Ltd., Suwon-si, Gyeonggi-do (KR)

(72) Inventors: Ken Machida, Yokohama (JP); Yoshiaki Sonobe, Yokohama (JP); Takeshi Kato, Nagoya (JP)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/169,653

(22) Filed: Oct. 24, 2018

(65) Prior Publication Data

US 2019/0164587 A1    May 30, 2019

(30) Foreign Application Priority Data

Nov. 27, 2017  (JP) .................... 2017-226830

(51) Int. Cl.
*G11C 11/16* (2006.01)
*G11B 5/39* (2006.01)
(Continued)

(52) U.S. Cl.
CPC .............. *G11C 11/161* (2013.01); *G11B 5/39* (2013.01); *G11B 5/3909* (2013.01); *G11C 11/1675* (2013.01); *H01L 27/228* (2013.01); *H01L 29/82* (2013.01); *H01L 43/08* (2013.01); *H01L 43/10* (2013.01)

(58) Field of Classification Search
None
See application file for complete search history.

(56) References Cited

U.S. PATENT DOCUMENTS

| 7,307,302 B2 | 12/2007 | Saito |
| 8,107,281 B2 | 1/2012 | Kai et al. |

(Continued)

FOREIGN PATENT DOCUMENTS

| JP | 2005-032878 | 2/2005 |
| JP | 2005-150303 | 6/2005 |

(Continued)

OTHER PUBLICATIONS

Machida et al. "Numerical Study on a Novel Curie Temperature Controlled Hybrid Thermo-Magnetic Structure for Magnetic Random Access Memories" IEEE Transactions on Magnetics 53(11):2002205 (Nov. 2017).

(Continued)

*Primary Examiner* — J. H. Hur
(74) *Attorney, Agent, or Firm* — Myers Bigel, P.A.

(57) ABSTRACT

Magnetic tunnel junction devices are provided. A magnetic tunnel junction device includes a pinned layer. The magnetic tunnel junction device includes a free layer on the pinned layer. The free layer includes a first layer, a second layer that is on the first layer, and a third layer that is between the first layer and the second layer. A Curie temperature of the third layer is lower than a Curie temperature of the first layer and lower than a Curie temperature of the second layer. Moreover, the magnetic tunnel junction device includes an insulating layer that is between the pinned layer and the free layer. Related magnetoresistive memory devices are also provided.

20 Claims, 11 Drawing Sheets

(51) Int. Cl.
  *H01L 29/82* (2006.01)
  *H01L 43/10* (2006.01)
  *H01L 27/22* (2006.01)
  *H01L 43/08* (2006.01)

(56) References Cited

U.S. PATENT DOCUMENTS

| | | | |
|---|---|---|---|
| 8,169,817 B2 | 5/2012 | Nakayama et al. | |
| 8,698,259 B2 | 4/2014 | Krounbi et al. | |
| 8,705,207 B2 | 4/2014 | Kanbe et al. | |
| 8,947,915 B2 | 2/2015 | Worledge et al. | |
| 9,349,944 B2 | 5/2016 | Takahashi et al. | |
| 9,484,529 B2 | 11/2016 | Lee et al. | |
| 9,490,298 B2 | 11/2016 | Kim et al. | |
| 2012/0233515 A1 | 9/2012 | Suzuki et al. | |
| 2014/0169082 A1* | 6/2014 | Worledge | G11C 11/161 |
| | | | 365/158 |
| 2014/0339660 A1 | 11/2014 | Lee et al. | |
| 2016/0125924 A1 | 5/2016 | Kita et al. | |
| 2017/0117455 A1 | 4/2017 | Kim et al. | |

FOREIGN PATENT DOCUMENTS

| | | |
|---|---|---|
| JP | 2011-071352 | 4/2011 |
| JP | 2014-116474 | 6/2014 |
| JP | 2015-126218 | 7/2015 |
| JP | 2016-063087 | 4/2016 |
| JP | 2016-063088 | 4/2016 |
| JP | 2016-092066 | 5/2016 |
| JP | 6346047 | 6/2018 |
| JP | 2018-133474 | 8/2018 |

OTHER PUBLICATIONS

Machida et al. "Magnetic tunnel junctions using Co/Pt multilayered free layers with perpendicular magnetic anisotropy" Journal of Physics: Conference Series 303(1):012100 (2011).

Yulaev et al. "Spin-transfer-torque reversal in perpendicular anisotropy spin valves with composite free layers" Applied Physics Letters 99:132502 (2011).

* cited by examiner

MAGNETIC TUNNEL JUNCTION DEVICES AND MAGNETORESISTIVE MEMORY DEVICES

CROSS-REFERENCE TO RELATED APPLICATION

This U.S. non-provisional patent application claims priority under 35 U.S.C. § 119 to Japanese Patent Application No. 2017-226830, filed on Nov. 27, 2017, in the Japan Patent Office, the disclosure of which is hereby incorporated herein by reference in its entirety.

BACKGROUND

The present disclosure herein relates to magnetic tunnel junction (MTJ) devices and magnetoresistive devices including the same. A magnetoresistive device that has a perpendicular magnetization and performs a read operation by a magnetoresistive effect may have a high resistance to thermal disturbance caused by fine patterns and may be expected as a next generation memory. This next generation memory may include an MTJ device including an MTJ layer that has a free layer having a variable magnetization direction, a reference layer maintaining a predetermined magnetization direction, and a barrier layer provided between the free layer and the reference layer.

A ferromagnetic material having a high perpendicular magnetic anisotropy and a high spin polarizability may be beneficial as a basic constituent material of the next generation memory. However, it may be difficult to obtain a material having a perpendicular magnetic anisotropy and a high spin polarizability. Practically, the material having the perpendicular magnetic anisotropy and the high spin polarizability may include only a cobalt-iron-boron (CoFeB) metal ferromagnetic material using interfacial magnetic anisotropy, and a selection range of the material may be very narrow. Thus, it may be difficult to use the material having the high perpendicular magnetic anisotropy and the high spin polarizability as the basic constituent material of the next generation memory.

Meanwhile, a composite layer-type recording layer has been suggested to solve these limitations. This recording layer may be obtained by coupling a ferromagnetic material layer having a high spin polarizability and a perpendicular magnetization maintaining layer having a high perpendicular magnetic anisotropy.

For example, Japanese Patent Publication No. 2014-116474 ("patent document 1") and Japanese Patent Publication No. 2016-092066 ("patent document 2") disclose the composite layer structure.

SUMMARY

A composite layer-type recording layer disclosed in the patent documents 1 and 2 normally operates in a constant temperature environment, but a write current of the composite layer-type recording layer is changed by a change in temperature. Therefore, it may be difficult to guarantee whether a write operation by magnetization reversal is normally performed at other temperatures. Thus, the composite layer-type recording layer of the patent documents 1 and 2 may need to reduce the dispersion (change) of the write current in a wide temperature range from −40° C. to +150° C.

The present disclosure may provide a magnetic tunnel junction device and a magnetoresistive memory device which are capable of reducing the dispersion (change) of a write current in a wide temperature range from −40° C. to +150° C.

A magnetic tunnel junction device, according to some embodiments, may include a free layer having a changeable magnetization direction. The magnetic tunnel junction device may include a pinned layer configured to maintain a predetermined magnetization direction. Moreover, the magnetic tunnel junction device may include an insulating layer between the free layer and the pinned layer. The free layer may include a perpendicularity maintaining layer configured to maintain a magnetization direction in a direction parallel to an easy axis of magnetization. The free layer may include a polarizable magnetic layer. Moreover, the free layer may include a magnetic coupling control layer between the perpendicularity maintaining layer and the polarizable magnetic layer. A Curie temperature of the magnetic coupling control layer may be lower than a Curie temperature of the perpendicularity maintaining layer and a Curie temperature of the polarizable magnetic layer. Moreover, the magnetic coupling control layer may be configured to reduce magnetic coupling of the perpendicularity maintaining layer and the polarizable magnetic layer as a temperature rises.

Because the Curie temperature of the magnetic coupling control layer may, in some embodiments, be lower than the Curie temperatures of the perpendicularity maintaining layer and the high polarizability magnetic layer, and because the magnetic coupling control layer may reduce the magnetic coupling of the perpendicularity maintaining layer and the high polarizability magnetic layer as the temperature rises, a write current necessary for magnetization reversal of the perpendicularity maintaining layer may be reduced. In addition, a distribution of the write current may be reduced in the wide temperature range from −40° C. to +150° C.

A magnetoresistive memory device, according to some embodiments, may include a magnetic tunnel junction device. The magnetoresistive memory device may include an electrode configured to apply a voltage to the magnetic tunnel junction device. The magnetic tunnel junction device may include a free layer having a changeable magnetization direction. The magnetic tunnel junction device may include a pinned layer configured to maintain a predetermined magnetization direction. The magnetic tunnel junction device may include an insulating layer between the free layer and the pinned layer. The free layer may include: a perpendicularity maintaining layer configured to maintain a magnetization direction in a direction parallel to an easy axis of magnetization; a polarizable magnetic layer; and a magnetic coupling control layer between the perpendicularity maintaining layer and the polarizable magnetic layer. A Curie temperature of the magnetic coupling control layer may be lower than a Curie temperature of the perpendicularity maintaining layer and a Curie temperature of the polarizable magnetic layer. Moreover, the magnetic coupling control layer may be configured to reduce magnetic coupling of the perpendicularity maintaining layer and the polarizable magnetic layer as a temperature rises.

According to the magnetoresistive memory device of some embodiments, because the Curie temperature of the magnetic coupling control layer is lower than the Curie temperatures of the perpendicularity maintaining layer and the high polarizability magnetic layer and the magnetic coupling control layer reduces the magnetic coupling of the perpendicularity maintaining layer and the high polarizability magnetic layer as the temperature rises, a write current necessary for magnetization reversal of the perpendicularity maintaining layer may be reduced. In addition, a distribution of the write current may be reduced in the wide temperature range from −40° C. to +150° C.

A magnetic tunnel junction device, according to some embodiments, may include a pinned layer. The magnetic tunnel junction device may include a free layer on the pinned layer. The free layer may include a first layer, a second layer on the first layer, and a third layer that is between the first layer and the second layer. A Curie temperature of the third layer may be lower than a Curie temperature of the first layer and lower than a Curie temperature of the second layer. Moreover, the magnetic tunnel junction device may include an insulating layer that is between the pinned layer and the free layer.

BRIEF DESCRIPTION OF THE DRAWINGS

The inventive concepts will become more apparent in view of the attached drawings and accompanying detailed description.

DETAILED DESCRIPTION

Figure 1:
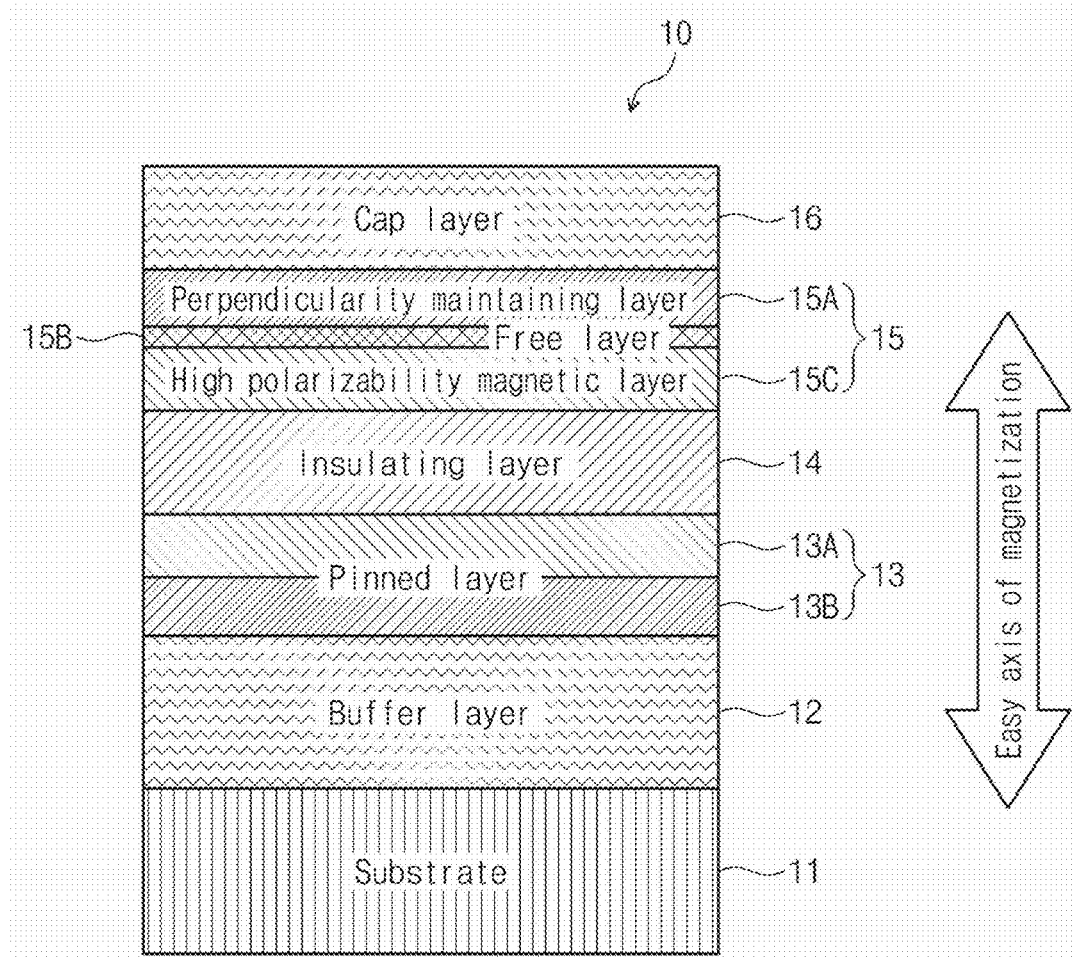
FIG. 1 is a cross-sectional view illustrating a magnetic tunnel junction device according to some embodiments of the inventive concepts.

Embodiments of the inventive concepts will be described in detail with reference to the accompanying drawings. FIG. 1 is a cross-sectional view illustrating a magnetic tunnel junction device according to some embodiments of the inventive concepts. Referring to FIG. 1, a magnetic tunnel junction device 10 may include a substrate 11, a buffer layer 12, a pinned layer 13, an insulating (e.g., insulation) layer 14, a free layer 15, and a cap layer 16.

The substrate 11 may be a silicon (Si) substrate. For example, the substrate 11 may be a silicon substrate having a thermal oxide layer, or a single-crystalline silicon substrate.

The buffer layer 12 may be a stabilization layer formed on the substrate 11. For example, the buffer layer 12 may include chromium (Cr), tantalum (Ta), gold (Au), tungsten (W), platinum (Pt), or titanium (Ti).

The pinned layer 13 may be a layer maintaining its magnetization direction in a predetermined (e.g., fixed) direction. The pinned layer 13 may include at least one selected from materials of which magnetization directions are not easily changed as compared with that of the free layer 15. In other words, the pinned layer 13 may include at least one selected from materials, each of which has a great (i.e., relatively high) effective magnetic anisotropy (Kueff), a great saturation magnetization (Ms), and a great magnetic relaxation constant (a). However, the material of the pinned layer 13 is not limited thereto. In some embodiments, the material of the pinned layer 13 may be selected from other various materials under various conditions. For example, the pinned layer 13 may include a layer 13A including a Heusler alloy as a main ingredient, and a Co/Pt multi-layer 13B. In some embodiments, the layer 13A including the Heusler alloy as the main ingredient may be a layer including a Co-based full-Heusler alloy as a main ingredient. For example, the Co-based full-Heusler alloy may be $Co_2FeSi$, $Co_2MnSi$, $Co_2FeMnSi$, $Co_2FeAl$, or $Co_2CrAl$, where Mn is manganese and Al is aluminum. In addition, the Co/Pt multi-layer 13B may have a great perpendicular magnetic anisotropy. As illustrated in FIG. 1, the layer 13A including the Heusler alloy as the main ingredient may be in contact with the insulating layer 14, and the Co/Pt multi-layer 13B may be in contact with the buffer layer 12. The pinned layer 13 may be referred to as a reference layer.

The insulating layer 14 may include an insulating material as a main ingredient. The insulating layer 14 may be disposed between the pinned layer 13 and the free layer 15 which have ferromagnetism. The insulating layer 14 may be formed of an insulating material such as magnesium oxide (MgO). In addition, the material of the insulating layer 14 may be an oxide having a sodium chloride (NaCl) lattice structure. For another example, the insulating layer 14 may include calcium oxide (CaO), strontium oxide (SrO), titanium oxide (TiO), vanadium oxide (VO), or niobium monoxide (NbO). However, embodiments of the inventive concepts are not limited thereto. In some embodiments, the insulating layer 14 may include spinel-type $MgAl_2O_4$. When a voltage is applied in a direction substantially perpendicular to junction surfaces of the pinned layer 13 and the free layer 15, a current may flow through the magnetic tunnel junction device 10 by a tunneling effect.

The free layer 15 may have an easy axis of magnetization which is parallel to a direction substantially perpendicular to a surface of the free layer 15. A magnetization direction of the free layer 15 may be changeable by magnetization rotation. The free layer 15 may include a perpendicularity maintaining layer 15A, a high polarizability magnetic layer 15C, and a magnetic coupling control layer 15B. As illustrated in FIG. 1, the high polarizability magnetic layer 15C, the magnetic coupling control layer 15B, and the perpendicularity maintaining layer 15A may be sequentially stacked on the insulating layer 14. The cap layer 16 may be stacked on the perpendicularity maintaining layer 15A. The free layer 15 may be referred to as a recording layer, a magnetization free layer, or a magnetization changeable or variable layer.

The perpendicularity maintaining layer 15A may be formed of a ferromagnetic substance having an easy axis of magnetization in a direction substantially perpendicular to a surface of the layer and may maintain a magnetization direction in such a way that the magnetization direction is parallel to the easy axis of magnetization. The ferromagnetic substance may have a L10 type iron-palladium (FePd), iron-platinum (FePt) or manganese-gallium (MnGa) alloy, a D022 type MnGa or manganese-germanium (MnGe) alloy, a Co/Pd multi-layer including Co and Pd alternately stacked, a Co/Pt multi-layer including Co and Pt alternately stacked, or a L11 type CoPd or CoPt alloy having a structure in which Co and Pd (or Pt) are alternately stacked with respect to an atom close-packed plane. In some embodiments, the perpendicularity maintaining layer 15A may include a ferrimagnetic substance having a compensation temperature (Tn) at which a magnetization becomes 0 (zero). For example, the perpendicularity maintaining layer 15A may include a rare earth-transition metal (RE-TM) alloy as a main ingredient. For example, the perpendicularity maintaining layer 15A may include $(Gd_{100-x}Tb_x)_z(Fe_{100-y}Co_y)_{100-z}$ ($0 \leq x \leq 100$, $0 \leq y \leq 100$, $20 < z < 35$)(at %) as a main ingredient, where Gd is gadolinium and Tb is terbium.

A thickness of the perpendicularity maintaining layer 15A may be at least 1 nanometer (nm) or more. For example, the thickness of the perpendicularity maintaining layer 15A may range from 2 nm to 5 nm.

The high polarizability magnetic layer 15C may have a high spin polarizability, and may be referred to herein as a "polarizable" magnetic layer. For example, the high polarizability magnetic layer 15C may include a Heusler alloy layer having a L21 structure or a B2 structure as a main ingredient. In particular, the high polarizability magnetic layer 15C may include a Co-based full-Heusler alloy as a main ingredient. Here, the Co-based full-Heusler alloy may be $Co_2FeMnSi$, $Co_2FeSi$, $Co_2MnSi$, $Co_2FeAl$, or $Co_2CrAl$. Alternatively, the high polarizability magnetic layer 15C may be a CoFeB magnetic layer having a great (i.e., relatively high) polarizability.

The magnetic coupling control layer 15B may control magnetic coupling of the perpendicularity maintaining layer 15A and the high polarizability magnetic layer 15C. In detail, the magnetic coupling control layer 15B may control the magnetic coupling of the perpendicularity maintaining layer 15A and the high polarizability magnetic layer 15C in such a way that the magnetic coupling thereof when a write current flows is less than the magnetic coupling thereof when the write current does not flow. In addition, the magnetic coupling control layer 15B may control the magnetic coupling of the perpendicularity maintaining layer 15A and the high polarizability magnetic layer 15C in such a way that the magnetic coupling thereof when a read current flows is greater than the magnetic coupling thereof when the write current flows. A temperature of the magnetic tunnel junction device when the write current flows may be higher than a temperature of the magnetic tunnel junction device when the read current flows. Thus, the magnetic coupling control layer 15B may reduce the magnetic coupling of the perpendicularity maintaining layer 15A and the high polarizability magnetic layer 15C as a temperature rises.

A Curie temperature of the magnetic coupling control layer 15B may be lower than a Curie temperature of the perpendicularity maintaining layer 15A and a Curie temperature of the high polarizability magnetic layer 15C. The magnetic coupling control layer 15B may reduce the magnetic coupling of the perpendicularity maintaining layer 15A and the high polarizability magnetic layer 15C by the combination of the perpendicularity maintaining layer 15A, the high polarizability magnetic layer 15C and the magnetic coupling control layer 15B as the temperature rises.

In detail, a temperature of the magnetic coupling control layer 15B may rise by the write current. The Curie temperature (e.g., 140° C.) of the magnetic coupling control layer 15B may be lower than those of the perpendicularity maintaining layer 15A and the high polarizability magnetic layer 15C. A perpendicular magnetic anisotropy of the magnetic coupling control layer 15B may be reduced by the write current, and heat disturbance of the magnetic coupling control layer 15B may be increased by the write current. Thus, the magnetic coupling control layer 15B may behave like a paramagnetic substance. As a result, coupling of magnetization of the high polarizability magnetic layer 15C and magnetization of the perpendicularity maintaining layer 15A may be reduced, and thus the magnetization direction of the high polarizability magnetic layer 15C may be inclined in an in-plane direction to easily perform magnetization reversal by a spin current.

In addition, the layers 15A, 15B and 15C may be controlled in such a way that in-plane magnetization may not affect or disturb a reversal of perpendicular magnetization of the high polarizability magnetic layer 15C when the perpendicular magnetization of the high polarizability magnetic layer 15C is reversed. Furthermore, after the perpendicular magnetization of the high polarizability magnetic layer 15C is reversed, a magnetization direction of the perpendicularity maintaining layer 15A may be the same as the magnetization direction of the high polarizability magnetic layer 15C.

Thus, the magnetic coupling control layer 15B may have a thickness capable of magnetically coupling the perpendicularity maintaining layer 15A and the high polarizability magnetic layer 15C. For example, the thickness of the magnetic coupling control layer 15B may be a non-zero thickness of 2 nm or less.

In addition, the magnetic coupling control layer 15B may include Pd/PdCo, Pt/PtCo, Pd/NiCo, Pt/NiCo, $Mn_3Ge_{1-x}Si_x$ ($0 < x \leq 0.3$, at %), $C_{38}$—$(Mn_{0.8}Cr_{0.2})$ GaGe (at %), $(Mn_{0.8}Fe_{0.2})$ GaGe (at %), or $(Gd_{100-x}Tb_x)_z(Fe_{100-y}Co_y)_{100-z}$ ($0 \leq x \leq 100$, $0 \leq y \leq 100$, $20 < z < 35$, at %) corresponding to a RE-TM material, where Ni is nickel.

The cap layer 16 may be a stabilization layer formed on the free layer 15. In some embodiments, the cap layer 16 may include ruthenium (Ru) and Ta.

Figure 2:
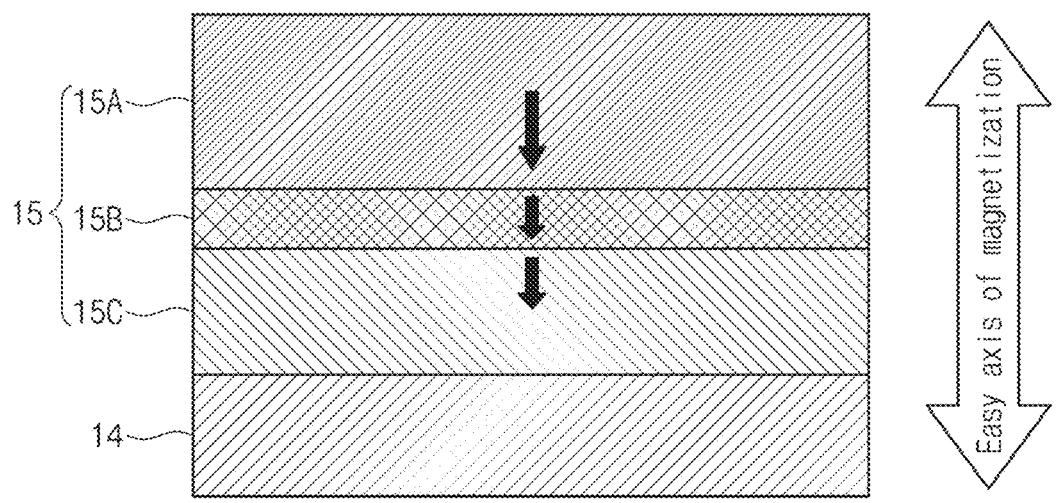
FIG. 2 is a cross-sectional view illustrating a rewrite process of the magnetic tunnel junction device according to some embodiments of the inventive concepts.
Figure 3:
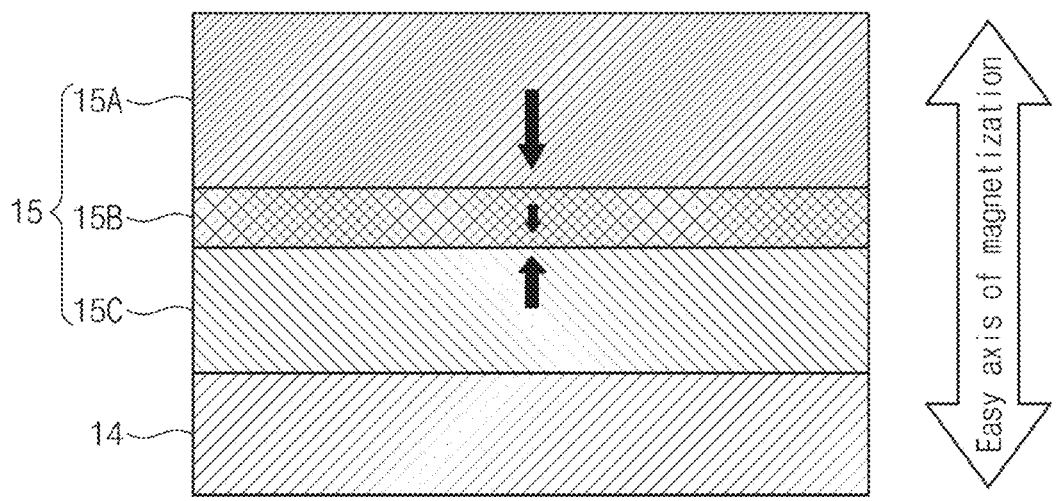
FIG. 3 is a cross-sectional view illustrating a rewrite process of the magnetic tunnel junction device according to some embodiments of the inventive concepts.
Figure 4:
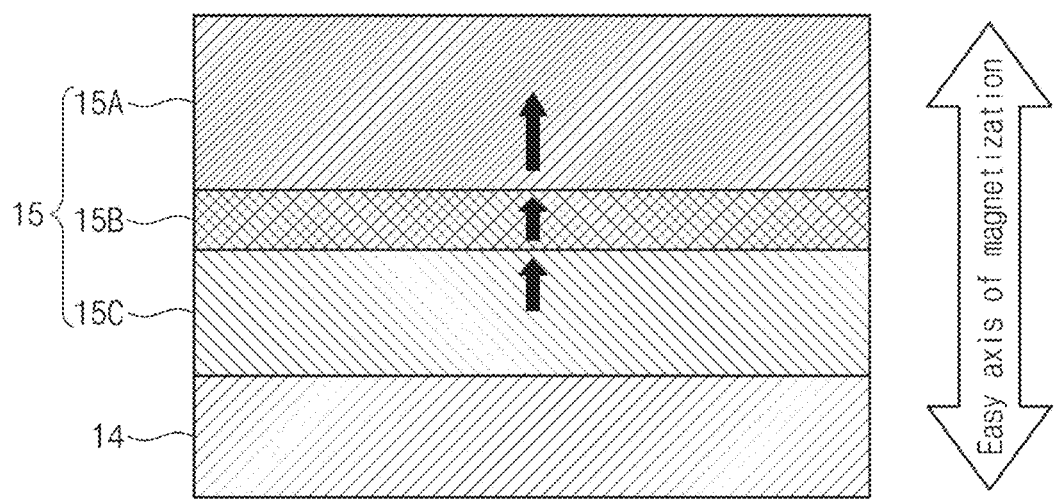
FIG. 4 is a cross-sectional view illustrating a rewrite process of the magnetic tunnel junction device according to some embodiments of the inventive concepts.

The magnetic tunnel junction device 10 may be configured as described above. Next, a principle in which a magnetization reversal current of the free layer 15 is reduced will be described. FIGS. 2, 3 and 4 are cross-sectional views illustrating a rewrite process of the magnetic tunnel junction device according to some embodiments of the inventive concepts. In FIGS. 2, 3 and 4, arrows indicate magnetization directions.

As illustrated in FIG. 2, first, the perpendicularity maintaining layer 15A and the high polarizability magnetic layer 15C may have perpendicular magnetization directions in a downward direction of the figure (i.e., a direction toward the insulating layer 14).

Thereafter, a write current may flow through the magnetic tunnel junction device 10 to increase a temperature of the magnetic tunnel junction device 10, and thus a change in state of the free layer 15 may occur in FIG. 3. The perpendicular magnetic anisotropy of the magnetic coupling control layer 15B of which the Curie temperature (e.g., 140° C.)

is lower than those of the perpendicularity maintaining layer 15A and the high polarizability magnetic layer 15C may be reduced as the temperature rises. In addition, the heat disturbance of the magnetic coupling control layer 15B may be increased, and thus the magnetic coupling control layer 15B may behave like a paramagnetic substance. As a result, the coupling of the magnetization of the high polarizability magnetic layer 15C and the magnetization of the perpendicularity maintaining layer 15A may be reduced, and thus the magnetization direction of the high polarizability magnetic layer 15C may be inclined in the in-plane direction to easily perform the magnetization reversal by the spin current. In FIG. 3, the magnetization direction of the high polarizability magnetic layer 15C may be changed from the downward direction into an upward direction. A current value at this time may be significantly reduced as compared with that of a typical composite MTJ.

After a write operation is finished, the free layer 15 may be in a state illustrated in FIG. 4. A read operation may be performed in the state of FIG. 4. Since a read current is less than the write current, a temperature when the read current flows through the magnetic tunnel junction device 10 may be lower than a temperature when the write current flows through the magnetic tunnel junction device 10.

As described above, the write current of the write operation may be reduced by the temperature and differences in state between the layers of the free layer 15 in each of the operations of FIGS. 2 to 4, and thus thermal stability may be maintained in the read operation.

Next, the state illustrated in FIG. 3 will be described in more detail. Since the temperature of the magnetic tunnel junction device 10 rises by the write current in the write operation as described above, the coupling of the magnetization of the high polarizability magnetic layer 15C and the magnetization of the perpendicularity maintaining layer 15A may be reduced, and thus the magnetization direction of the high polarizability magnetic layer 15C may be easily reversed.

In addition, a magnetic anisotropy constant Ku1 of the perpendicularity maintaining layer 15A, a magnetic anisotropy constant Ku2 of the magnetic coupling control layer 15B, and a magnetic anisotropy constant Ku3 of the high polarizability magnetic layer 15C may satisfy a relation of Ku1≥Ku2>Ku3 at a temperature when the read current flows.

Moreover, since the Curie temperature (Tc) of the magnetic coupling control layer 15B is lowered when the temperature rises by the write current, a reduction in the magnetic anisotropy constant Ku2 of the magnetic coupling control layer 15B may be greater than a reduction in the magnetic anisotropy constant Ku1 of the perpendicularity maintaining layer 15A, and thus the magnetic anisotropy constants Ku1, Ku2 and Ku3 of the layers 15A, 15B and 15C may satisfy a relation of Ku1>Ku2≥Ku3. In other words, the free layer 15 may have a three-layer structure (e.g., a graded-Ku structure) in which the magnetic anisotropy constant Ku is changed in three steps in a thickness direction of the free layer 15. The magnetization of the three-layer structure of the free layer 15 may be easily reversed as compared with that of a typical two-layer structure (e.g., an exchange spring-like structure). A difference in the magnetic anisotropy constant Ku between adjacent layers in the three-layer structure may be less than a difference in magnetic anisotropy constant between adjacent layers in the two-layer structure, and thus it is possible to reduce the write current necessary for the magnetization reversal of the perpendicularity maintaining layer 15A.

Figure 5:
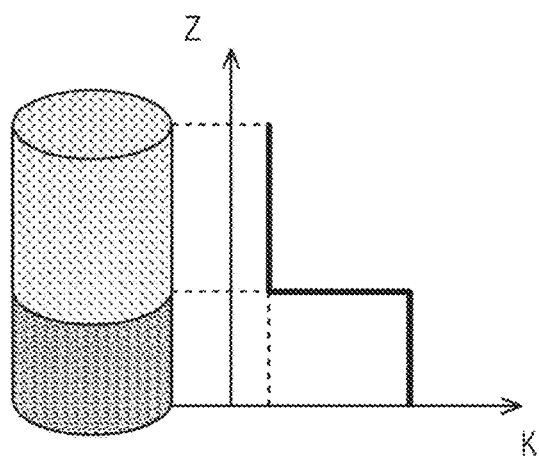
FIG. 5 is a view illustrating an example of a structure and a magnetic anisotropy constant of a free layer having a two-layer structure.

FIG. 5 is a view illustrating an example (exchange spring-like) of a structure and a magnetic anisotropy constant Ku of a free layer 15 having a two-layer structure. As illustrated in FIG. 5, since a difference in magnetic anisotropy constant Ku between the perpendicularity maintaining layer 15A and the high polarizability magnetic layer 15C is great, a write current necessary for magnetization reversal of the perpendicularity maintaining layer 15A may be great.

Figure 6:
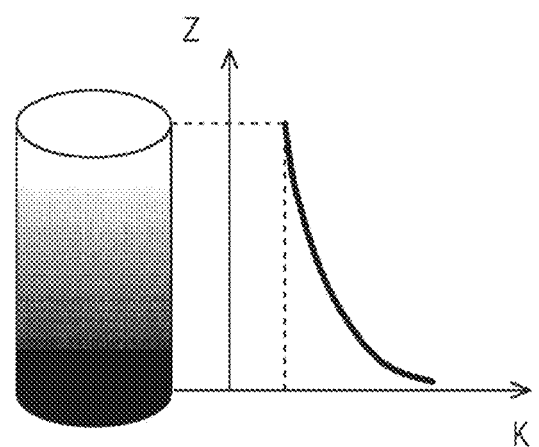
FIG. 6 is a view illustrating an example of a structure and a magnetic anisotropy constant of a free layer having a multi-layer structure.

On the other hand, FIG. 6 is a view illustrating an example (graded-like) of a structure and a magnetic anisotropy constant Ku of the free layer 15 having a multi-layer structure. As illustrated in FIG. 6, the free layer 15 may have three or more layers and may be configured such that the magnetic anisotropy constant Ku is gently changed in the perpendicular magnetization direction. In FIG. 6, since a difference in magnetic anisotropy constant Ku between adjacent layers to each other is small, the write current necessary for magnetization reversal may be small. In addition, in some embodiments, the free layer 15 includes the perpendicularity maintaining layer 15A, the high polarizability magnetic layer 15C, and the magnetic coupling control layer 15B. However, embodiments of the inventive concepts are not limited thereto. In some embodiments, the free layer 15 may include four or more layers, and thus the magnetic anisotropy constant Ku may be gently changed as illustrated in FIG. 6.

An experiment for verifying the principle described above was performed. Magnetization curves at the room temperature and 172° C. were obtained from a $[Co_{(0.4)}/Pd_{(1.2)}]_3/[CoPd_{(0.3)}/Pd_{(1.2)}]_3/[Co_{(0.4)}/Pt_{(1.2)}]_6$ multi-layer. The $[CoPd_{(0.3)}/Pd_{(1.2)}]_3$ multi-layer has the function of the magnetic coupling control layer 15B.

Figure 7:
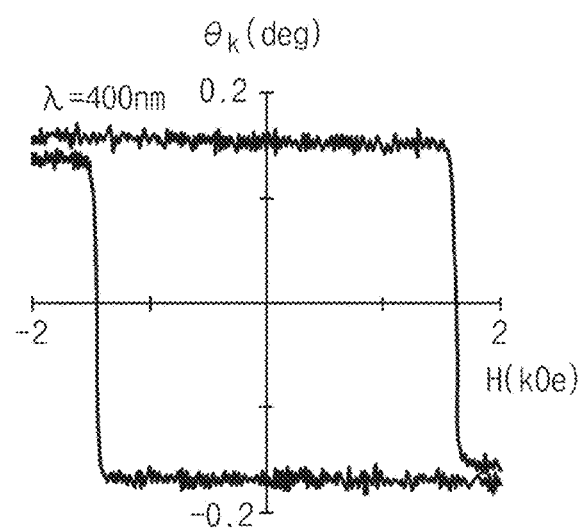
FIG. 7 is a graph showing a magnetization curve of a free layer having a three-layer structure at a temperature equal to or less than a Curie temperature of a magnetic coupling control layer.

FIG. 7 is a graph showing the magnetization curve at the room temperature. In FIG. 7, a horizontal axis shows a magnetic field axis (kOe), and a vertical axis shows a Kerr rotation angle ($\theta_k$). Since the perpendicularity maintaining layer 15A is strongly magnetically coupled to the high polarizability magnetic layer 15C at the room temperature, a hysteresis loop without a step difference is obtained as shown in FIG. 7. This may mean that the magnetization directions of the perpendicularity maintaining layer 15A and the high polarizability magnetic layer 15C are reversed together.

Figure 8:
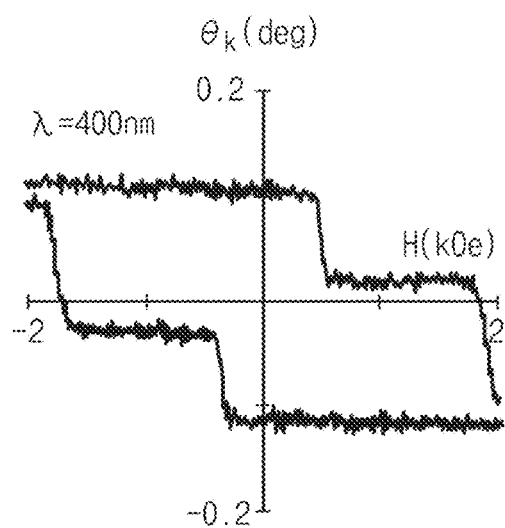
FIG. 8 is a graph showing a magnetization curve of the free layer having the three-layer structure at a temperature equal to or greater than the Curie temperature of the magnetic coupling control layer.

FIG. 8 is a graph of the magnetization curve showing behavior of the free layer 15 of which the temperature rises to 172° C. in the write operation. In FIG. 8, a horizontal axis shows a magnetic field axis (kOe), and a vertical axis shows a Kerr rotation angle ($\theta_k$). Since the magnetic coupling of the perpendicularity maintaining layer 15A and the high polarizability magnetic layer 15C is weakened when the write current flows, a shape of a hysteresis loop with a step difference is obtained as shown in FIG. 8. This may mean that the magnetization directions of the perpendicularity maintaining layer 15A and the high polarizability magnetic layer 15C are individually reversed.

In other words, in the free layer 15 which has the three-layer structure including the magnetic coupling control layer 15B having the low Curie temperature (Tc), it may be easy to individually reverse the magnetization directions of the perpendicularity maintaining layer 15A and the high polarizability magnetic layer 15C in the write operation, and thus the write current for the magnetization reversal may be reduced.

In addition, in the read operation, the temperature of the magnetic tunnel junction device 10 may be relatively low, and thus the magnetic tunnel junction device 10 may thermally stably behave. Since a magnitude of energy for thermal stability is proportional to an equation of Ku1h1+

Ku2h2+Ku3h3 (where 'h1', 'h2', and 'h3' are a thickness of the perpendicularity maintaining layer, a thickness of the magnetic coupling control layer, and a thickness of the high polarizability magnetic layer, respectively), the magnetic tunnel junction device 10 may be thermally very stable. In the read operation, the magnetization of the perpendicularity maintaining layer 15A may be strongly coupled to the magnetization of the high polarizability magnetic layer 15C, and thus the magnetization direction of the free layer 15 may not be reversed. The Curie temperature (Tc) of the perpendicularity maintaining layer 15A may be equal to the Curie temperature (Tc) of the high polarizability magnetic layer 15C and may be greater (i.e., higher) than the Curie temperature (Tc) of the magnetic coupling control layer 15B.

In addition to the verifying experiment, a write current characteristic was calculated by a simulation using a Landau-Lifshitz-Bloch (LLB) equation. For example, a consumption current in the write operation was evaluated by a current density when the magnetization direction of the free layer 15 was reversed or switched.

Details and set parameters of the perpendicularity maintaining layer 15A, the magnetic coupling control layer 15B and the high polarizability magnetic layer 15C will be described hereinafter.

(1) Perpendicularity Maintaining Layer 15A
Material: two kinds of FePt-based materials for the room temperature and a high temperature were introduced. Parameters (CGS Gauss) are shown in the following table 1.
Magnetization (Ms1): $1000 \times 10^3$ A/m (1000 emu/cc)
Perpendicular magnetic anisotropy constant (Ku1): $7.8 \times 10^5$ J/m$^3$ or $8.58 \times 10^5$ J/m$^3$ (7.8 Merg/cc or 8.58 Merg/cc) at the room temperature
Damping constant: $\alpha = 0.01$
Curie temperature (Tc1, high Tc): 700K (2) Magnetic Coupling Control Layer 15B
Material: a MnCrGaGe-based material and a MnFeGa-based material were introduced. Parameters (CGS Gauss) are shown in the following table 1.
Curie temperature (Tc2, low Tc): 450K
Perpendicular magnetic anisotropy constant (Ku2): $7.8 \times 10^5$ J/m$^3$ or $8.58 \times 10^5$ J/m$^3$ (7.8 Merg/cc or 8.58 Merg/cc)
Magnetization (Ms2): $600 \times 10^3$ A/m (600 emu/cc)
In addition, the cases in which the perpendicular magnetic anisotropy constants (Ku1 and Ku2) of the perpendicularity maintaining layer 15A and the magnetic coupling control layer 15B are great (i.e., relatively high) are referred to as 'high A'.

(3) High Polarizability Magnetic Layer 15C
Material: CoFe, CoFeB and CFMS(Co$_2$FeMnSi) materials were introduced. Parameters (CGS Gauss) are shown in the following table 1.
Magnetization (Ms3): $1000 \times 10^3$ A/m (1000 emu/cc)
Perpendicular magnetic anisotropy constant (Ku3): 0 J/m$^3$ (0 erg/cc)
Damping constant: $\alpha = 0.01$
Curie temperature (Tc3, high Tc): 700K

TABLE 1

| | $\alpha$ (damping) | $K_{u0}$ [Merg/cc] | $M_{s0}$ [emu/cc] | $T_c$ [K] |
|---|---|---|---|---|
| 15A | 0.01 | 7.8, 8.58 (high A) | 1000 | 700 |
| 15B | 0.01 | 7.8, 8.58 (high A) | 600 | 450 |
| 15C | 0.01 | 0 | 1000 | 700 |

Here, the parameters represented in CGS units in parentheses were used in the LLB simulation described above. In addition, the parameters represented in SI units and described together therewith are converted into the parameters represented in the CGS units in the parentheses by the following conversion formulas (A) and (B).

$$10 \text{ erg/cc} = 1 \text{ J/m}^3 \quad (A)$$

$$1 \text{ G} = 1 \text{ emu/cc} = 1 \times 10^3 \text{ A/m} \quad (B)$$

A height (a thickness) of the perpendicularity maintaining layer 15A was 2 nm (h1=2 nm), a height of the magnetic coupling control layer 15B was 1.0 nm (h2=1 nm), and a height of the high polarizability magnetic layer 15C was 1 nm (h3=1 nm).

A diameter (D, a width) of the free layer 15 was 20 nm. Here, it was assumed that the free layer 15 had a cylindrical shape, and a diameter of a cross section of the free layer 15 was used as a value representing a size of the free layer 15. When the cross section of the free layer 15 is a circle, the size of the free layer 15 may use the diameter of the free layer 15. Alternatively, when the cross section of the free layer 15 is an ellipse, the size of the free layer 15 may use a long diameter (e.g., the longest diameter in an ellipse) of the free layer 15. When the cross section of the free layer 15 has another shape, the size of the free layer 15 may use a diameter of a circle circumscribed about the free layer 15.

Figure 9:
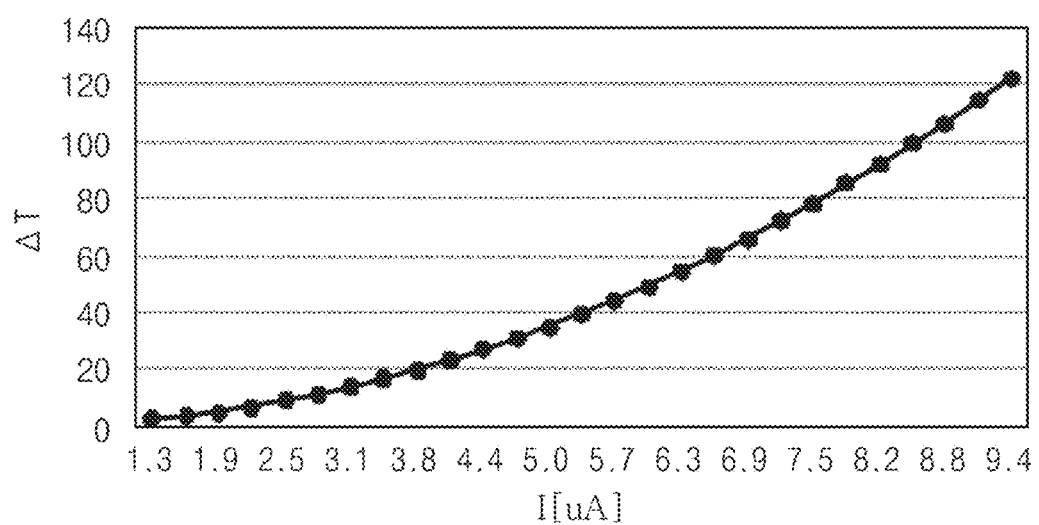
FIG. 9 is a graph showing a change in a write current value according to a rise in temperature.

A rise in temperature ($\Delta T$) was used as a parameter, and a change in temperature corresponding to a write current value was set from 2.1° C. to 123° C. The temperature in a write operation was changed as shown in FIG. 9. FIG. 9 is a graph showing a change in a write current value according to a rise in temperature. It was assumed that a temperature change amount was the same in the free layer 15.

It was assumed that the following temperature change occurred in the free layer 15 in the write operation.

(1) After the write current was applied, the temperature of the free layer 15 rose, and thus the free layer 15 reached a saturation state within 1 nanosecond (ns).

(2) Thereafter, the write current was applied for 10 nanoseconds. At this time, a temperature of the device was in a normal state.

(3) After the write operation, the temperature of the free layer 15 was reduced to 300K within 5 nanoseconds.

Figure 10:
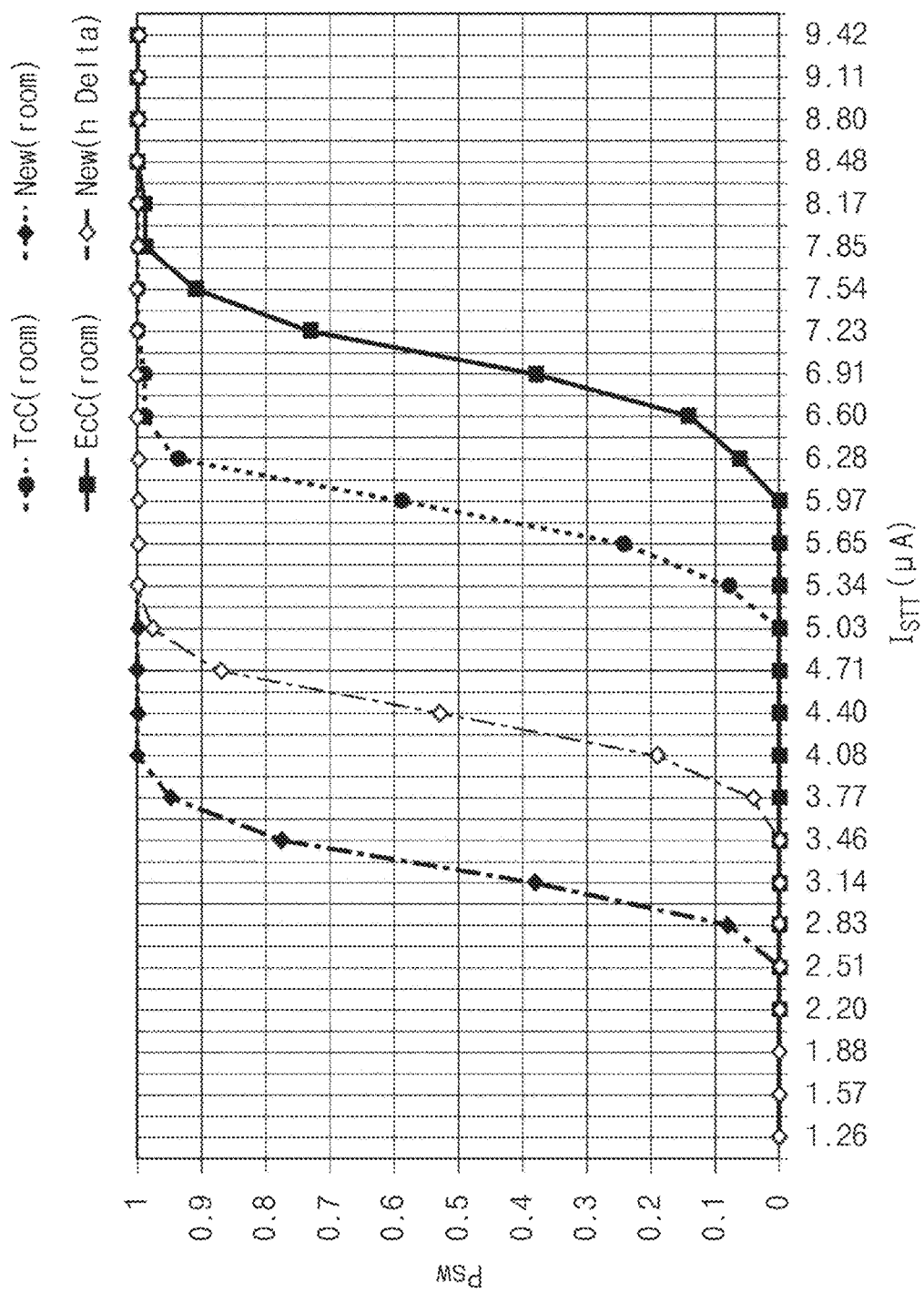
FIG. 10 is a graph showing write current characteristics.
Figure 11:
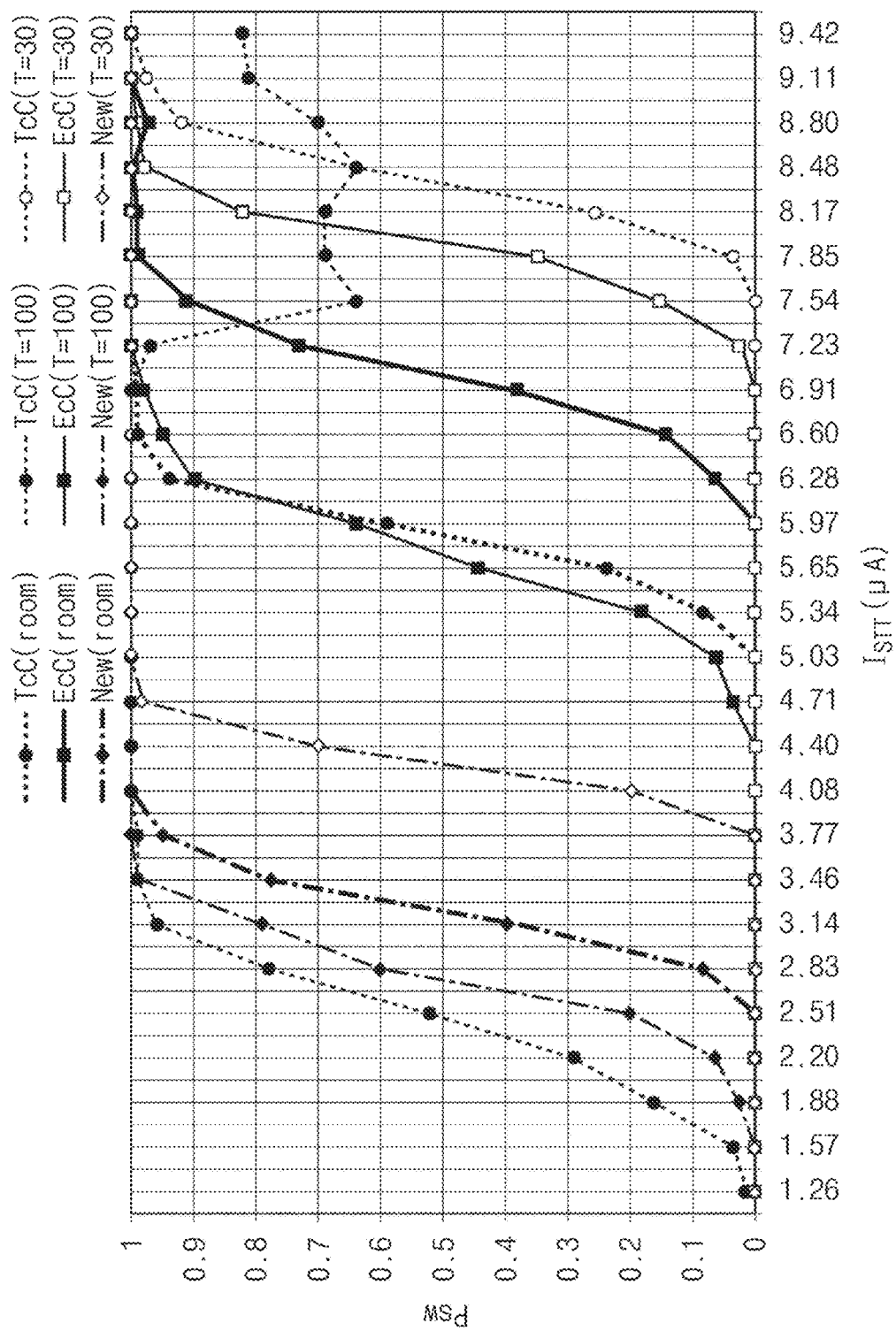
FIG. 11 is a graph showing write current characteristics.

FIGS. 10 and 11 are graphs showing write current characteristics. FIG. 10 shows write current characteristics when an operating temperature of the device is the room temperature. FIG. 11 shows write current characteristics when the operating temperature of the device is changed to −30° C., the room temperature, and 100° C. A horizontal axis represents a magnetization reversal current value, and a vertical axis represents reversal probability. FIGS. 10 and 11 show write current characteristics of a magnetic tunnel junction device having a TcC structure, write current characteristics of a magnetic tunnel junction device having an EcC structure, write current characteristics of the magnetic tunnel junction device 10 (New, having a thermal stability index of about 57 to about 60 near the room temperature) according to some embodiments, and write current characteristics of a device (h_delta, using Ku of high A of the table 1 to have a thermal stability index of about 70 near the room temperature) obtained by improving the thermal stability index of the magnetic tunnel junction device 10 of some embodiments. In addition, the TcC structure is disclosed in IEEE Trans. Magn. DOI: TMAG. 2711247, Machida et al. (2017). The EcC structure is disclosed in Appl. Phys. Lett. 99, 132502, Yulaev, et al. (2011).

Referring to FIG. 10, the write current value of the magnetic tunnel junction device 10 of some embodiments is reduced by about 50%, compared to those of the magnetic tunnel junction device having the TcC structure and the magnetic tunnel junction device having the EcC structure.

As described above, according to the magnetic tunnel junction device 10 of some embodiments, the Curie temperature of the magnetic coupling control layer 15B may be lower than the Curie temperature of the perpendicularity maintaining layer 15A and the Curie temperature of the high polarizability magnetic layer 15C, and the magnetic coupling control layer 15B may reduce the magnetic coupling of the perpendicularity maintaining layer 15A and the high polarizability magnetic layer 15C as the temperature rises. Thus, the write current necessary for the magnetization reversal of the perpendicularity maintaining layer may be reduced.

As shown in FIG. 11, the write current necessary for the magnetization reversal of the perpendicularity maintaining layer 15A may be reduced in a wide temperature range from −40° C. to +150° C.

Figure 12:
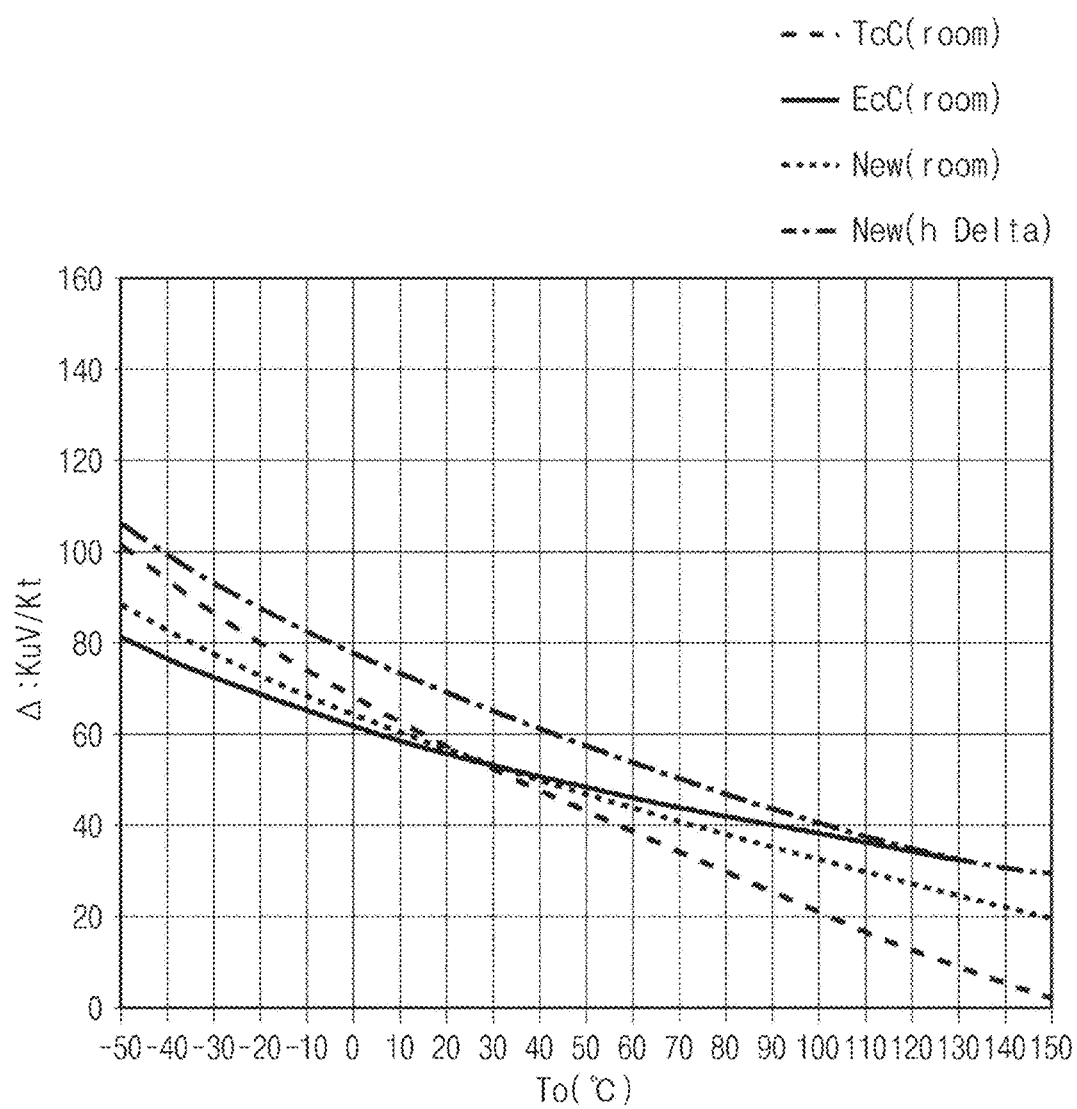
FIG. 12 is a graph showing a change in temperature of a thermal stability index.

FIG. 12 is a graph showing a change in temperature of a thermal stability index. In FIG. 12, a horizontal axis represents an operating temperature in a read operation, and a vertical axis represents a thermal stability index (ΔKuV/Kt). Here, 'K' is the Boltzmann constant, and 't' is a temperature.

As shown in FIG. 12, changes in the thermal stability index and the write current of the magnetic tunnel junction device 10 of some embodiments are inhibited in the wide temperature range from −40° C. to +150° C., as compared with those of the magnetic tunnel junction device having the TcC structure and the magnetic tunnel junction device having the EcC structure.

Thus, according to the magnetic tunnel junction device 10 of some embodiments, a distribution of the write current may be small in the wide temperature range from −40° C. to +150° C.

In some embodiments, the magnetic coupling control layer 15B is a single layer. Alternatively, the magnetic coupling control layer 15B may include a plurality of layers. In some embodiments, the magnetic coupling control layer 15B including the plurality of layers will be described as an example.

Figure 13:
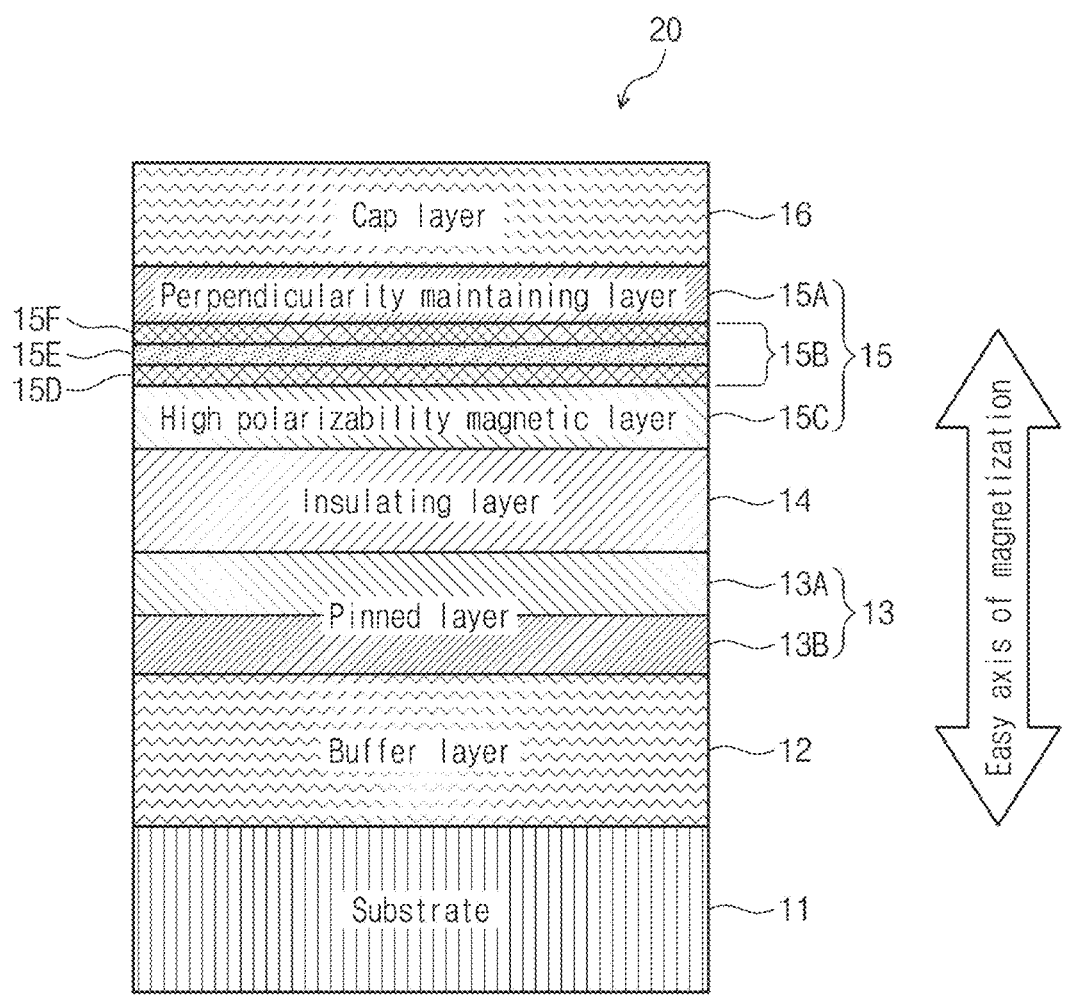
FIG. 13 is a cross-sectional view illustrating a magnetic tunnel junction device according to some embodiments of the inventive concepts.

FIG. 13 is a cross-sectional view illustrating a magnetic tunnel junction device according to some embodiments of the inventive concepts. In FIG. 13, the same components or elements as in FIG. 1 will be indicated by the same reference numerals or designators, and the descriptions thereto will be omitted.

Referring to FIG. 13, a magnetic tunnel junction device 20 may include the substrate 11, the buffer layer 12, the pinned layer 13, the insulating layer 14, a free layer 15, and the cap layer 16. The free layer 15 may include the perpendicularity maintaining layer 15A, the high polarizability magnetic layer 15C, and a magnetic coupling control layer 15B.

The magnetic coupling control layer 15B may include a first layer 15D, a second layer 15E, and a third layer 15F.

The first layer 15D may include CoPd or CoPt.

The second layer 15E may include Ru or iridium (Ir).

The third layer 15F may include CoPd or CoPt, like the first layer 15D.

By these components, the magnetic coupling control layer 15B may have a three-layer structure having a Ruderman-Kittel-Kasuya-Yosida (RKKY) interaction. When Ru or Ir is used, total magnetization of the free layer 15 may be reduced and a speed of the magnetization reversal may be increased.

According to the magnetic tunnel junction device 20 of some embodiments described above, the magnetic coupling control layer 15B between the perpendicularity maintaining layer 15A and the high polarizability magnetic layer 15C may reduce the distribution of the write current in the wide temperature range from −40° C. to +150° C. by the three-layer structure of low-Tc CoX/Ru (or Ir)/low-Tc CoX, which has the RKKY interaction.

A magnetoresistive memory device using the magnetic tunnel junction device 10 of some embodiments will be described.

Figure 14:
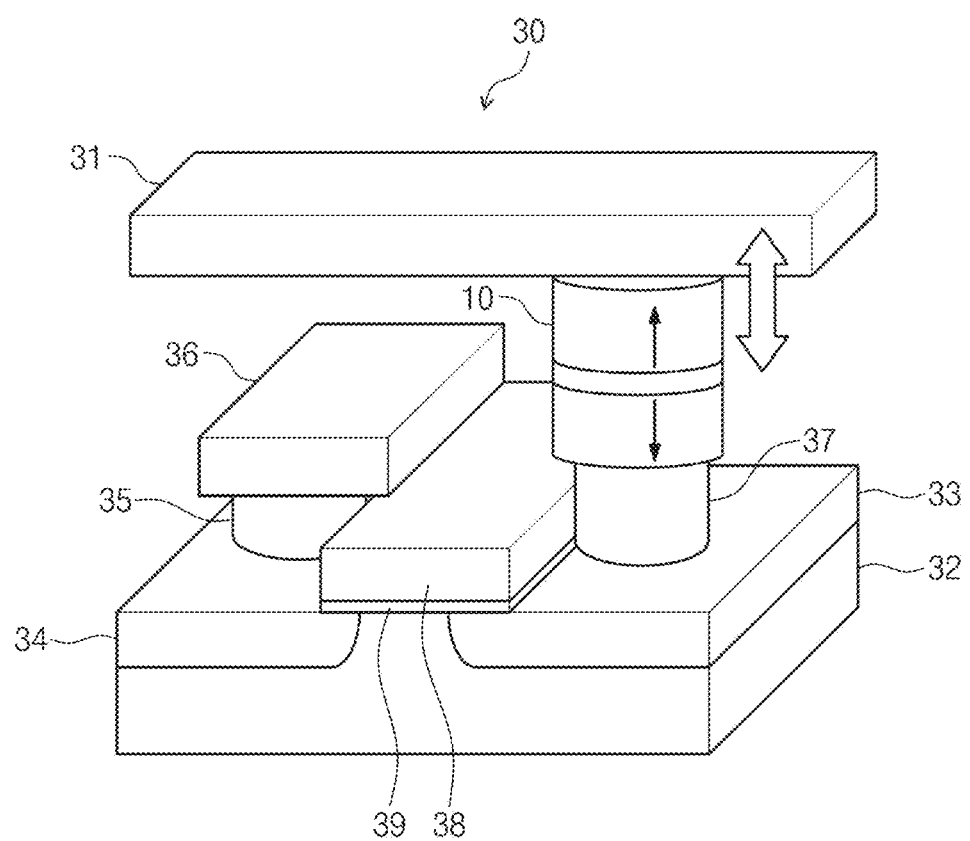
FIG. 14 is a perspective view illustrating main components of an example of a magnetoresistive memory device according to some embodiments of the inventive concepts.

FIG. 14 is a perspective view illustrating main components of an example of a magnetoresistive memory device according to some embodiments of the inventive concepts. Referring to FIG. 14, the magnetoresistive memory device may include a memory cell 30, a bit line 31, contact plugs 35 and 37, and a word line 38.

The memory cell 30 may include a semiconductor substrate 32, diffusion regions 33 and 34, a source line 36, a gate insulating layer 39, and a magnetic tunnel junction device 10. In some embodiments, the magnetic tunnel junction device 20 may be used in the memory cell 30 instead of the magnetic tunnel junction device 10.

The magnetoresistive memory device may include a plurality of the memory cells 30 arranged in a matrix form. The plurality of memory cells 30 may be connected to each other by using a plurality of the bit lines 31 and a plurality of the word lines 38. The magnetoresistive memory device (e.g., MRAM) may perform a write operation of data by a spin torque injection method (e.g., a spin torque transfer (STT) method). For example, a magnetic tunnel junction device 10 or 20 may be used in a perpendicular STT-MRAM device that has high integration density and uses a spin injection magnetization reversal effect.

The semiconductor substrate 32 may have the diffusion regions 33 and 34 at its surface, and the diffusion region 33 may be spaced apart from the diffusion region 34 by a predetermined distance. The diffusion region 33 may function as a drain region, and the diffusion region 34 may function as a source region. The diffusion region 33 may be connected to the magnetic tunnel junction device 10 with the contact plug 37 interposed therebetween.

The bit line 31 may be disposed over the semiconductor substrate 32 and may be connected to the magnetic tunnel junction device 10. The bit line 31 may be connected to a write circuit and a read circuit.

The diffusion region 34 may be connected to the source line 36 with the contact plug 35 interposed therebetween. The source line 36 may be connected to the write circuit and the read circuit.

The word line 38 may be adjacent to the diffusion regions 33 and 34 and may be disposed on the semiconductor substrate 32 with the gate insulating layer 39 interposed therebetween. The word line 38 and the gate insulating layer 39 may function as a selection transistor. A current may be supplied from a circuit, and thus the word line 38 may be activated and the selection transistor may be turned on.

In the magnetoresistive memory device, a voltage may be applied to the magnetic tunnel junction device 10 by using the bit line 31 and the diffusion region 33 as electrodes, and thus a magnetization direction of a ferromagnetic layer (e.g., the free layer) may be changed by spin torque of electrons aligned in a certain direction. In addition, a data value written in the magnetoresistive memory device may be changed by changing a current direction.

According to the magnetoresistive memory device of some embodiments described above, the Curie temperature of the magnetic coupling control layer may be lower than the Curie temperature of the perpendicularity maintaining layer and the Curie temperature of the high polarizability magnetic layer, and the magnetic coupling control layer may reduce the magnetic coupling of the perpendicularity maintaining layer and the high polarizability magnetic layer as the temperature rises. Thus, the write current necessary for the magnetization reversal of the perpendicularity maintaining layer may be reduced. In addition, according to the magnetoresistive memory device of some embodiments, the distribution of the write current may be reduced in the wide temperature range from −40° C. to +150° C.

However, the inventive concepts are not limited to the aforementioned embodiments, and the embodiments may be variously changed or modified without departing from the scope of the inventive concepts. For example, since the magnetic anisotropy constant (Ku) of the perpendicularity maintaining layer is less than that of the magnetic coupling control layer at the room temperature, the same effects may be expected in a parameter in which the magnetic anisotropy of the perpendicularity maintaining layer becomes less than the magnetic anisotropy of the magnetic coupling control layer in the write operation.

In the magnetic tunnel junction device according to some embodiments, the magnetic anisotropy constant of the magnetic coupling control layer may be equal to or greater than the magnetic anisotropy constant of the high polarizability magnetic layer at the temperature when the write current flows through the magnetic tunnel junction device.

In the magnetic tunnel junction device according to some embodiments, the magnetic anisotropy constant of the high polarizability magnetic layer may be 0 (zero) at the temperature when the write current flows through the magnetic tunnel junction device.

In the magnetic tunnel junction device according to some embodiments, the magnetic anisotropy constants of the perpendicularity maintaining layer and the magnetic coupling control layer may be equal to each other at the temperature when the write current flows through the magnetic tunnel junction device, and the magnetic anisotropy constant of the perpendicularity maintaining layer may be greater than the magnetic anisotropy constant of the magnetic coupling control layer at a temperature higher than the room temperature. In some embodiments, the magnetic coupling control layer 15B may have a structure which has two layers having other magnetic anisotropy constants (Ku2a and Ku2b).

According to some embodiments of the inventive concepts, the magnetic tunnel junction device may reduce the distribution of the write current in the wide temperature range from −40° C. to +150° C.

While the inventive concepts have been described with reference to example embodiments, it will be apparent to those skilled in the art that various changes and modifications may be made without departing from the scope of the inventive concepts. Therefore, it should be understood that the above example embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A magnetic tunnel junction device comprising:
    a free layer comprising a changeable magnetization direction;
    a pinned layer configured to maintain a predetermined magnetization direction; and
    an insulating layer between the free layer and the pinned layer,
    wherein the free layer comprises:
        a perpendicularity maintaining layer configured to maintain a magnetization direction in a direction parallel to an easy axis of magnetization;
        a polarizable magnetic layer; and
        a magnetic coupling control layer between the perpendicularity maintaining layer and the polarizable magnetic layer, and
    wherein a Curie temperature of the magnetic coupling control layer is lower than a Curie temperature of the perpendicularity maintaining layer and a Curie temperature of the polarizable magnetic layer,
    wherein a magnetic anisotropy constant of the polarizable magnetic layer is equal to or less than a magnetic anisotropy constant of the magnetic coupling control layer in a temperature range from −40° C. to +150° C., and
    wherein the magnetic coupling control layer is configured to reduce magnetic coupling of the perpendicularity maintaining layer and the polarizable magnetic layer as a temperature rises.

2. The magnetic tunnel junction device of claim 1, wherein a magnetic anisotropy constant of the perpendicularity maintaining layer is greater than the magnetic anisotropy constant of the magnetic coupling control layer in the temperature range from −40° C. to +150° C.

3. The magnetic tunnel junction device of claim 1, wherein the magnetic coupling control layer comprises Pd/PdCo, Pt/PtCo, Pt/NiCo, Pd/NiCo, $Mn_3Ge_{1-x}Si_x$ (0<x≤0.3, at %), $C_{38}$—$(Mn_{0.8}Cr_{0.2})GaGe$ (at %), $(Mn_{0.8}Fe_{0.2})GaGe$ (at %), or $(Gd_{100-x}Tb_x)_z(Fe_{100-y}Co_y)_{100-z}$ (0≤x≤100, 0≤y≤100, 20<z<35, at %) corresponding to a rare earth-transition metal (RE-TM) material.

4. The magnetic tunnel junction device of claim 1, wherein a thickness of the magnetic coupling control layer is a non-zero thickness of 2 nm or less.

5. The magnetic tunnel junction device of claim 1, wherein the magnetic coupling control layer comprises a three-layer structure having a Ruderman-Kittel-Kasuya-Yosida (RKKY) interaction, the three-layer structure comprising:
    a first layer comprising cobalt-palladium (CoPd) or cobalt-platinum (CoPt);
    a second layer comprising ruthenium (Ru) or iridium (Ir); and
    a third layer comprising CoPd or CoPt.

6. A magnetoresistive memory device comprising:
    a magnetic tunnel junction device; and
    an electrode configured to apply a voltage to the magnetic tunnel junction device,
    wherein the magnetic tunnel junction device comprises:
    a free layer comprising a changeable magnetization direction;
    a pinned layer configured to maintain a predetermined magnetization direction; and
    an insulating layer between the free layer and the pinned layer,
    wherein the free layer comprises: a perpendicularity maintaining layer configured to maintain a magnetization direction in a direction parallel to an easy axis of magnetization; a polarizable magnetic layer; and a magnetic coupling control layer between the perpendicularity maintaining layer and the polarizable magnetic layer,
    wherein a Curie temperature of the magnetic coupling control layer is lower than a Curie temperature of the perpendicularity maintaining layer and a Curie temperature of the polarizable magnetic layer,
wherein the Curie temperature of the perpendicularity maintaining layer and the Curie temperature of the polarizable magnetic layer are each higher than a temperature of the magnetic tunnel junction device during a write operation of the magnetoresistive memory device, and
wherein the magnetic coupling control layer is configured to reduce magnetic coupling of the perpendicularity maintaining layer and the polarizable magnetic layer as the temperature of the magnetic tunnel junction device rises.

7. The magnetoresistive memory device of claim 6, wherein the Curie temperature of the perpendicularity maintaining layer and the Curie temperature of the polarizable magnetic layer are each higher than 450 Kelvin.

8. A magnetic tunnel junction device comprising:
a pinned layer;
a free layer on the pinned layer, wherein the free layer comprises:
a first layer;
a second layer on the first layer; and
a third layer that is between the first layer and the second layer, wherein a Curie temperature of the third layer is lower than a Curie temperature of the first layer and lower than a Curie temperature of the second layer, and wherein a magnetic anisotropy constant of the second layer is higher than a magnetic anisotropy constant of the first layer; and
an insulating layer that is between the pinned layer and the free layer.

9. The magnetic tunnel junction device of claim 8, wherein the third layer is configured to control magnetic coupling of the first layer and the second layer.

10. The magnetic tunnel junction device of claim 8, wherein a magnetic anisotropy constant of the third layer is higher than the magnetic anisotropy constant of the first layer.

11. The magnetic tunnel junction device of claim 10, wherein the magnetic anisotropy constant of the second layer is higher than the magnetic anisotropy constant of the third layer at a temperature that is higher than room temperature.

12. The magnetic tunnel junction device of claim 8, wherein the third layer is thinner than the second layer.

13. The magnetic tunnel junction device of claim 8, wherein the Curie temperature of the first layer is equal to the Curie temperature of the second layer.

14. The magnetic tunnel junction device of claim 8, wherein the third layer comprises a plurality of layers.

15. The magnetic tunnel junction device of claim 14, wherein the plurality of layers comprises:
two layers comprising cobalt-palladium (CoPd) or cobalt-platinum (CoPt); and
a layer comprising ruthenium (Ru) or iridium (Ir) that is between the two layers.

16. The magnetic tunnel junction device of claim 8, wherein a magnetization of the third layer is lower than a magnetization of the first layer and lower than a magnetization of the second layer.

17. The magnetic tunnel junction device of claim 8,
wherein the first layer comprises a magnetic layer,
wherein the second layer comprises a perpendicularity maintaining layer that is configured to maintain a magnetization direction in a direction parallel to an easy axis of magnetization, and
wherein the third layer comprises a magnetic coupling control layer.

18. The magnetic tunnel junction device of claim 17, wherein the magnetic layer comprises a Heusler alloy layer or a cobalt-iron-boron (CoFeB) magnetic layer.

19. The magnetic tunnel junction device of claim 17, wherein the magnetic coupling control layer is configured to reduce magnetic coupling of the perpendicularity maintaining layer and the magnetic layer as a temperature rises.

20. The magnetic tunnel junction device of claim 8, wherein the Curie temperature of the first layer and the Curie temperature of the second layer are each higher than a temperature of the magnetic tunnel junction device during a write operation of the magnetic tunnel junction device.

* * * * *